United States Patent
Georgakos et al.

(10) Patent No.: US 12,352,802 B2
(45) Date of Patent: Jul. 8, 2025

(54) CIRCUITS AND TECHNIQUES FOR PREDICTING END OF LIFE BASED ON IN SITU MONITORS AND LIMIT VALUES DEFINED FOR THE IN SITU MONITORS

(71) Applicant: Infineon Technologies AG, Neubiberg (DE)

(72) Inventors: Georg Georgakos, Erding (DE); Bernhard Gstoettenbauer, Engerwitzdorf (AT); Dirk Hammerschmidt, Villach (AT); Veit Kleeberger, Munich (DE); Ludwig Rossmeier, Dorfen (DE); Rafael Zalman, Markt Schwaben (DE); Thomas Zettler, Hoehenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 640 days.

(21) Appl. No.: 17/457,221

(22) Filed: Dec. 1, 2021

(65) Prior Publication Data
US 2023/0168295 A1    Jun. 1, 2023

(51) Int. Cl.
*G01R 31/26* (2020.01)
*G01R 31/27* (2006.01)

(52) U.S. Cl.
CPC ......... *G01R 31/2642* (2013.01); *G01R 31/27* (2013.01)

(58) Field of Classification Search
CPC ............... G01R 31/2642; G01R 31/27; G01R 31/2856; G01R 31/2832; G06F 11/008
See application file for complete search history.

(56) References Cited

U.S. PATENT DOCUMENTS

| | | | |
|---|---|---|---|
| 9,465,373 B2 | 10/2016 | Allen-Ware et al. | |
| 10,250,029 B2 | 4/2019 | Carletti et al. | |
| 10,699,041 B2 | 6/2020 | Hammerschmidt | |
| 2008/0116455 A1* | 5/2008 | Jain | H03L 1/00 257/E27.001 |
| 2011/0006919 A1* | 1/2011 | Lundberg | H05B 45/58 340/963 |
| 2014/0068298 A1 | 3/2014 | Simeral | |
| 2014/0312873 A1 | 10/2014 | Raja et al. | |
| 2016/0249915 A1* | 9/2016 | Beckman | A61L 2/00 227/175.1 |

(Continued)

OTHER PUBLICATIONS

"Einfluss von Alterungseffekten auf die Robustheit digitaler Schaltungen", Retrieved from https://www.edacentrum.de/robust/de/content/zue/04_zue12-robust-tutorial-TUM.pdf, Retrieved on Sep. 15, 2021, 40 pp.

(Continued)

*Primary Examiner* — Manuel A Rivera Vargas
(74) *Attorney, Agent, or Firm* — Shumaker & Sieffert, P.A.

(57) ABSTRACT

In some examples, a circuit comprises a function unit configured to perform a circuit function, and one or more in situ monitors configured to measure internal data associated with the circuit. The circuit may further comprise a memory configured to store one or more limit values associated with the one or more in situ monitors, and a lifetime model unit configured to determine whether the circuit has reached an end-of-life threshold based on the measured internal data from the one or more in situ monitors and the limit values.

18 Claims, 6 Drawing Sheets

(56) References Cited

U.S. PATENT DOCUMENTS

2017/0160338 A1* 6/2017 Connor ............ G11C 29/50016
2017/0255732 A1* 9/2017 Milor .................... G06F 11/073
2017/0277455 A1* 9/2017 Sunada ............... G06F 11/2284

OTHER PUBLICATIONS

Automotive Electronics Council, "Failure Mechanism Based Stress Test Qualification for Integrated Circuits", Automotive Electronics Council, Sep. 11, 2014, 48 pp.

IEC, "Reliability data handbook—Universal model for reliability prediction of electronics components, PCBs and equipment", International Electrotechnical Commission, First edition, Received on Sep. 15, 2021, 96 pp.

Jenkins et al., "On-chip circuit to monitor long-term NBTI and PBTI degradation," Microelectronics Reliability, ELSEVIER, accepted Jul. 10, 2013, 5 pp.

Ritter et al., "Aging sensors for on-chip metallization of integrated LDMOS transistors under cyclic thermo-mechanical stress," Microelectronics Reliability, ELSEVIER, accepted Jun. 6, 2017, 5 pp.

Ritter et al., "Resistance change in on-chip aluminum interconnects under cyclic thermo-mechanical stress," Microelectronics Reliability, ELSEVIER, Jun. 7, 2019, 5 pp.

U.S. Appl. No. 16/915,794, filed Jun. 29, 2021, naming inventors De Gasperi et al.

U.S. Appl. No. 17/457,166, filed Dec. 1, 2021, naming inventors Gstoettenbauer et al.

U.S. Appl. No. 17/457,183, filed Dec. 1, 2021, naming inventors Zettler et al.

U.S. Appl. No. 17/457,198, filed Dec. 1, 2021, naming inventors Rossmeier et al.

U.S. Appl. No. 17/457,207, filed Dec. 1, 2021, naming inventors Hammerschmidt et al.

U.S. Appl. No. 17/457,216, filed Dec. 1, 2021, naming inventors Kleeberger et al.

* cited by examiner

CIRCUITS AND TECHNIQUES FOR PREDICTING END OF LIFE BASED ON IN SITU MONITORS AND LIMIT VALUES DEFINED FOR THE IN SITU MONITORS

TECHNICAL FIELD

This disclosure relates to semiconductor circuits, and more specifically, circuits and techniques for assessing and managing semiconductor circuits during use.

BACKGROUND

Semiconductor circuits are used in a wide variety of circuit applications in order to perform any of a variety of circuit functions. Unfortunately, semiconductor circuits can degrade over time. For example, aging, environmental exposure, stress, or other conditions can lead to semiconductor degradation and possibly end-of-life circuit failure, which is undesirable. The amount of stress conditions applied to semiconductor circuits strongly varies from case to case. As a result, the actual operational lifetime of a semiconductor circuit may be unpredictable.

In many situations, semiconductor circuits may be designed to tolerate an assumed worst-case mission profile during the lifetime of a system into which the circuit will be installed (e.g., a vehicle). Only a small percentage of devices will actually be exposed to the worst-case mission profile. Consequently, many semiconductor circuits are overdesigned with respect to their actual mission profile, which can increase production costs associated with the semiconductor circuits.

Sometimes, in unforeseeable exceptional cases, which may be caused by failures within a larger system (e.g., a vehicle), even the worst-case mission profile can be exceeded, and a circuit may reach its end-of-life earlier than expected, due to the excessive stress exposure. Such situations of excessive circuit life degradation may occur even if the circuit does not directly fail in the situation where the stress actually occurs. For vehicle circuits, examples for such exceptional erroneous conditions may include overheating of the engine due to loss of cooling fluid or massive electromagnetic exposure due to coupling between another faulty system component, which may cause high transients in a wiring harness.

SUMMARY

This disclosure describes techniques and circuits for assessing aging effects in circuits and predicting future problems in circuits before the problems occur. The described circuits and techniques may determine whether the circuit has reached an end-of-life threshold based on measured data associated with the circuit. The measured data, for example, may be identified by one or more in situ monitors within the circuit. Moreover, the measured data may be compared to limit values defined by an extended high temperature operating life (eHTOL) test, and in some cases, the limit values may be updated based on failure data associated with other circuits operating in the field. In any case, based on a comparison of the measured data from the one or more in situ monitors and the limit values, the circuit may be configured to determine whether the circuit has reached an end-of-life threshold, in which case, predictive maintenance may be recommended or required for the circuit within a larger system.

The described circuits and techniques may be used with a wide variety of circuits designed for a wide variety of different circuit functions. The techniques and circuits described in this disclosure may provide predictive alerts that can predict future circuit problems before the problems occur in functional circuits. In this way, system maintenance can be identified and performed (e.g., to replace functional circuits within a larger system) before the system exhibits actual problems or failure. The circuits and techniques of this disclosure may promote safety and reliability in devices or systems, such as in a vehicle or a similar setting.

In one example, this disclosure describes a circuit comprising: a function unit configured to perform a circuit function; one or more in situ monitors configured to measure internal data associated with the circuit; a memory configured to store one or more limit values associated with the one or more in situ monitors; and a lifetime model unit configured to determine whether the circuit has reached an end-of-life threshold based on the measured internal data from the one or more in situ monitors and the limit values.

In another example, this disclosure describes a method of operating a circuit, the method comprising: storing one or more limit values in a memory associated with the circuit; performing a circuit function via the circuit; measuring internal data associated with the circuit via one or more in situ monitors, wherein the one or more limit values are defined for the one or more in situ monitors; and determining whether the circuit has reached an end-of-life threshold based on the measured internal data from the one or more in situ monitors and the limit values stored in the memory.

In another example, this disclosure describes a system. The system may comprise a circuit and an external computer. The circuit may comprise a function unit configured to perform a circuit function; one or more in situ monitors configured to measure internal data associated with the circuit; a memory configured to store one or more limit values associated with the one or more in situ monitors; a lifetime model unit configured to determine whether the circuit has reached an end-of-life threshold based on the measured internal data from the one or more in situ monitors and the limit values; and a data transfer unit. The external computer may be configured to communicate with the data transfer unit, wherein the data transfer unit is configured to receive updates to the limit values from the external computer, wherein the updates are based on other data associated with one or more other circuits that have failed during operation.

The details of one or more examples are set forth in the accompanying drawings and the description below. Other features, objects, and advantages will be apparent from the description and drawings, and from the claims.

DETAILED DESCRIPTION

Figure 1:
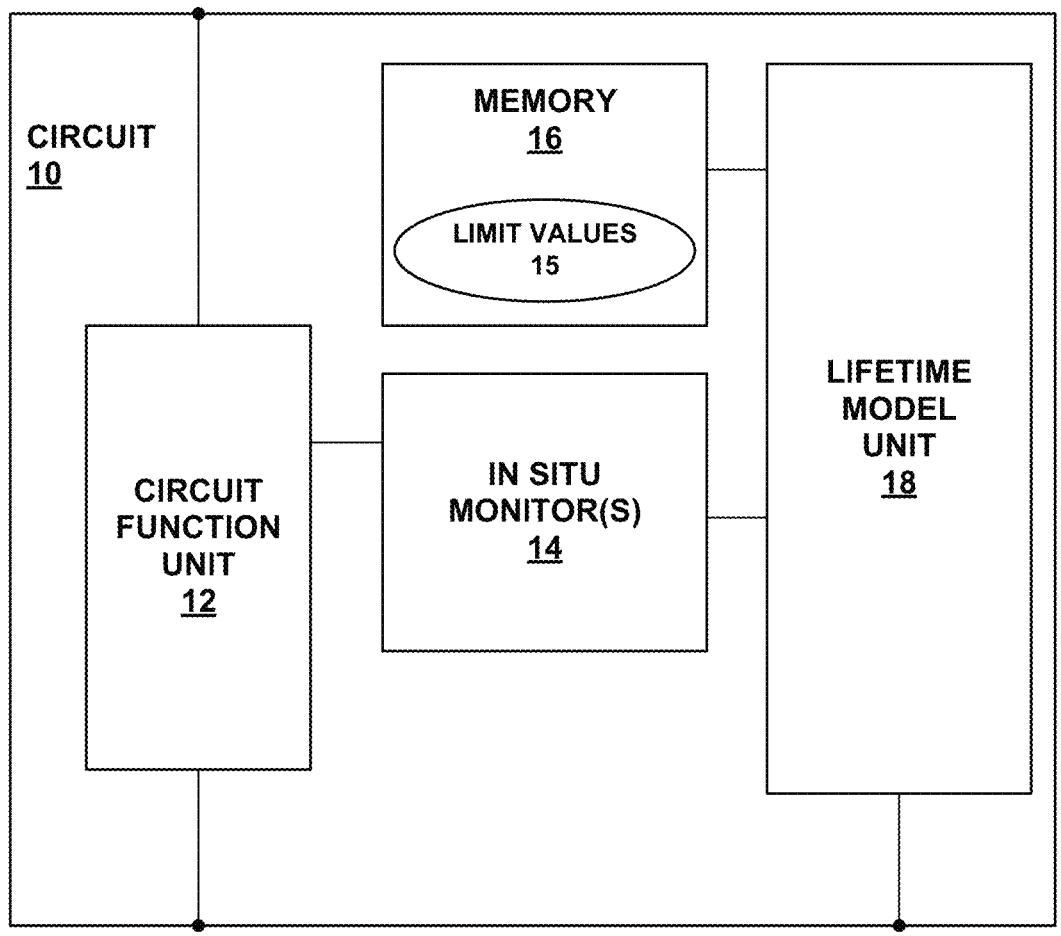
FIG. 1 is a block diagram showing a circuit according to an example of this disclosure.

This disclosure describes techniques and circuits for assessing aging effects in circuits and for predicting future problems in circuits before the problems occur. This disclosure also describes techniques and circuits for promoting circuit safety and reliability. The described circuits and techniques may be used with a wide variety of circuits designed for a wide variety of different circuit functions. The circuits and techniques may promote safety and reliability in devices or systems, such as in a vehicle or a similar setting. Modern vehicles and other modern devices or systems may include a large number of functional circuits, and monitoring the health or operational safety of any of a wide variety of functional circuits is desirable to promote safety and reliability vehicles or other devices or systems.

The described circuits and techniques may determine whether the circuit has reached an end-of-life threshold based on measured internal data associated with the circuit. The measured internal data, for example, may be identified by one or more in situ monitors within the circuit. Moreover, the measured internal data may be compared to limit values defined by an extended high temperature operating life (eHTOL) test, and in some cases, the limit values may be updated based on failure data associated with other circuits operating in the field. In any case, based on a comparison of the measured internal data from the one or more in situ monitors and the limit values, the circuit may be configured to determine whether the circuit has reached an end-of-life threshold, in which case, predictive maintenance may be recommended or required for the circuit within a larger system.

The described circuits and techniques may be used with a wide variety of circuits designed for a wide variety of different circuit functions. The techniques and circuits described in this disclosure may provide predictive alerts that can predict future circuit problems before the problems occur in functional circuits. In this way, system maintenance can be identified and performed (e.g., to replace functional circuits within a larger system) before the system exhibits actual problems or failure. The circuits and techniques of this disclosure may promote safety and reliability in devices or systems, such as in a vehicle or a similar setting.

In some examples, the techniques and circuits described in this disclosure may provide predictive alerts that can predict circuit problems due to the circuit reaching its end-of-life before such problems or failures occur in a functional circuit. Moreover, in some cases, the techniques and circuits of this disclosure for predicting future problems in a circuit may be used in combination with other techniques that detect or monitor for actual circuit problems (e.g., faults, shorts, overvoltage, overcurrent, or other problems) that may currently exist. Accordingly, the techniques of this disclosure may generate system alerts in response to identifying actual existing problems with a functional circuit, and the techniques of this disclosure may also generate predictive system alerts to predict future problems with the functional circuit (e.g., to prompt anticipatory maintenance on the system due to the circuit reaching its end-of-life).

FIG. 1 is a block diagram of an example circuit 10 according to this disclosure. As shown in FIG. 1, circuit 10 includes a circuit function unit 12 configured to perform a circuit function, and one or more in situ monitors 14 configured to measure internal data associated with the circuit function unit 12. Circuit 10 also includes a memory 16 configured to store one or more limit values 15 associated with the one or more in situ monitors 14. The limit values, for example, may be defined by an HTOL test or an eHTOL test performed during manufacture of circuit 10. Moreover, in some examples, the limit values can be updated based on failure data associated with other circuits (e.g., similar circuits within similar systems) operating in the field. The limit values may include a guard band, and according to this disclosure, in some examples, the guard band of one or more limit values can be minimized based on exhaustive stress tests that initially define the limit values and further minimized based on information gathered from failed devices in the field.

Circuit 10 also includes a lifetime model unit 18. According to this disclosure, lifetime model unit 18 is configured to determine whether circuit 10 (specifically circuit function unit 12) has reached an end-of-life threshold based on the measured internal data from the one or more in situ monitors 14 and the limit values 15 stored in memory 16. In some examples, limit values 15 are initially defined based on an accelerated stress test that is performed on a subset of circuits during a manufacturing process of a set of circuits, wherein the subset is a representative portion of the set. In other words, accelerated stress tests may be performed on a representative sample of a large batch of manufactured circuits in order to define limit values 15. The limit values 15, for example, may define values of internal circuit characteristics wherein if the values of the internal circuit characteristics exceed such limit values 15, circuit degradation may exist.

Circuit function unit 12, for example, may comprise any of a wide variety of circuits used in a larger system. For example, circuit function unit 12 may comprise a driver circuit configured to drive a load. In another example, circuit function unit 12 may comprise a logic circuit configured to perform one or more logic functions. In another example, circuit function unit 12 may comprise a motor driver configured to drive a motor such as a multi-phase motor. In another example, circuit function unit 12 may comprise an oscillator circuit configured to generate an oscillating signal. In another example, circuit function unit 12 may comprise a level shifter circuit configured to shift or change the voltage level of a signal. In another example, circuit function unit 12 may comprise a phase shift circuit configured to shift the phase of a signal. In another example, circuit function unit 12 may comprise a phase locked loop circuit configured to provide an output signal having a phase that is based on the input signal. In another example, circuit function unit 12 may comprise an analog-to-digital converter (ADC) circuit configured to convert an analog signal to a digital signal. In another example, circuit function unit 12 may comprise a digital-to-analog converter (DAC) circuit configured to convert a digital signal to an analog signal. In another example, circuit function unit 12 may comprise an arithmetic logic unit (ALU) configured to perform an arithmetic function. In still other examples, circuit function unit 12 may comprise a processor, a microcontroller, a digital signal processor (DSP), a communication interface circuit such as a serial peripheral interface (SPI) or another type of communication interface circuit, a digital logic circuit, a state machine, a signal processing circuit, a control circuit, an analog function circuit, a memory circuit, a sensor, a sensor combined with at least a part of its readout and signal processing circuit, a communication interface or any other circuit configured to perform one or more circuit functions.

The accelerated stress test that is performed on a subset of circuits to define limit values 15, for example, may comprises a HTOL test. More specifically, the HTOL test of this disclosure may comprise an eHTOL test that is extended in terms of the amount of stress that is applied relative to a normal HTOL test and extended over a plurality of circuits (and possibly extended to a plurality of circuit parameters for each of the plurality of circuits) to define limit values 15 for an individual circuit. In this way, limit values 15 can be minimized as much as possible in the initial manufacturing stage of circuit 10.

In some examples, in situ monitors 14 may refer to any monitor that directly measures an internal characteristic of circuit function unit 12 or a specific part of the intended circuit function. An in situ monitor 14 may be different than a replica of an intended circuit function insofar as a replica performs indirect measurements. Moreover, an in situ monitor 14 may be different than a generic parameter tracker for tracking supply voltage, temperature, or other inputs or outputs associated with circuit function unit. Instead, in situ monitor 14 may comprise a monitor of one or more internal parameters of circuit function unit 12, such as internal parameters that cannot be measured in any input or output pins associated with circuit 10. Examples for internal characteristic data that can be monitored by in situ monitor 14 may include leakage current of specific and sensitive circuit parts, slack (e.g., a time of data arrival compared to clock), failure counts such as counts of error correction codes (ECCs) in a protected memory, delay drift, frequency drift, or other data indicative of internal characteristics of circuit function unit 12.

In some examples, the one or more in situ monitors 14 are configured to measure data associated with circuit function unit 12 (e.g., internal operating parameter or events) under pre-defined operating conditions of circuit 10. In some examples, the one or more in situ monitors 14 are configured to measure the internal data associated with circuit function unit 12 (e.g., internal operating parameter or events) during periods of time that are outside of normal operation. For example, the one or more in situ monitors 14 are configured to measure the internal data associated with circuit function unit 12 (e.g., internal operating parameter or events) during a start-up process associated with circuit 10 or during a power-down process associated with circuit 10. Also, in some examples, the one or more in situ monitors 14 are configured to measure the internal data associated with circuit function unit 12 (e.g., internal operating parameter or events) during a periodic end-of-life check process for circuit 10.

In some examples, in situ monitors 14 are configured to measure internal parameters or events within circuit function unit 12 under defined conditions, e.g. a defined amount of slack during a defined benchmark in order to enable data comparison under similar conditions.

In some examples, lifetime model unit 18 may include a data transfer unit (not shown in FIG. 1). In this case, the data transfer unit may be configured to receive updates to limit values 15, wherein the updates are based on other data associated with one or more other circuits that have failed during operation in the field. In this way, limit values 15 can be further minimized based on actual circuit data of similar circuits operating in the field.

Moreover, in some examples, lifetime model unit 18 may include an age tracker (not shown in FIG. 1). In this case, the age tracker may be configured to track an age associated with circuit 10. Furthermore, in this case, a data transfer unit within lifetime model unit 18 may be configured to communicate the age associated with circuit 10 and a status indication for circuit 10 to the external computer. Updates to limit values 15, in this case, may be based on the other data associated with one or more other circuits that have failed during operation and the age associated with circuit 10. In addition, by communicating the age associated with circuit 10 and a status indication for circuit 10 (e.g., indicating whether circuit 10 has failed) to the external computer, the external computer may use data associated with circuit 10 in modeling or defining limit values for other similar circuits in the field.

Age information associated with circuit 10 may be especially useful to external computers if the age information is associated with status information indicative of the status of circuit 10 in the field. For example, if circuit 10 fails, its age information and a status indication of failure may be useful to the external computer in defining limit values for other similar circuits that are still operating in the field.

In some examples, lifetime model unit 18 may include a data transfer unit configured to communicate the measured internal data from the one or more in situ monitors 14 to an external computer in response to the lifetime model unit 18 determining that circuit 10 has reached an end-of-life threshold. To make this determination, for example, lifetime model unit 18 may include a compare unit configured to compare the measured internal data from in situ monitor(s) to the one or more limit values 15.

In some examples, lifetime model unit 18 may be configured to output an alert (e.g., a system-level alert) in response to identifying that circuit 10 has reached the end-of-life threshold. Moreover, in some examples, lifetime model unit 18 may be configured to disable at least a portion of circuit 10 in response to identifying that circuit 10 has reached the end-of-life threshold.

An alert from failure prediction unit 18, for example, may comprise a predictive maintenance alert sent to another circuit, such as an ECU, a system-level microprocessor or any external system-level circuit. Based on the predictive maintenance alert, a larger system may schedule, suggest, or require maintenance on circuit 10 or circuit function unit 12, e.g., before the circuit reaches its end of life and before any actual safety issues occur due to aging, stress, or overuse of circuit 10.

Figure 2:
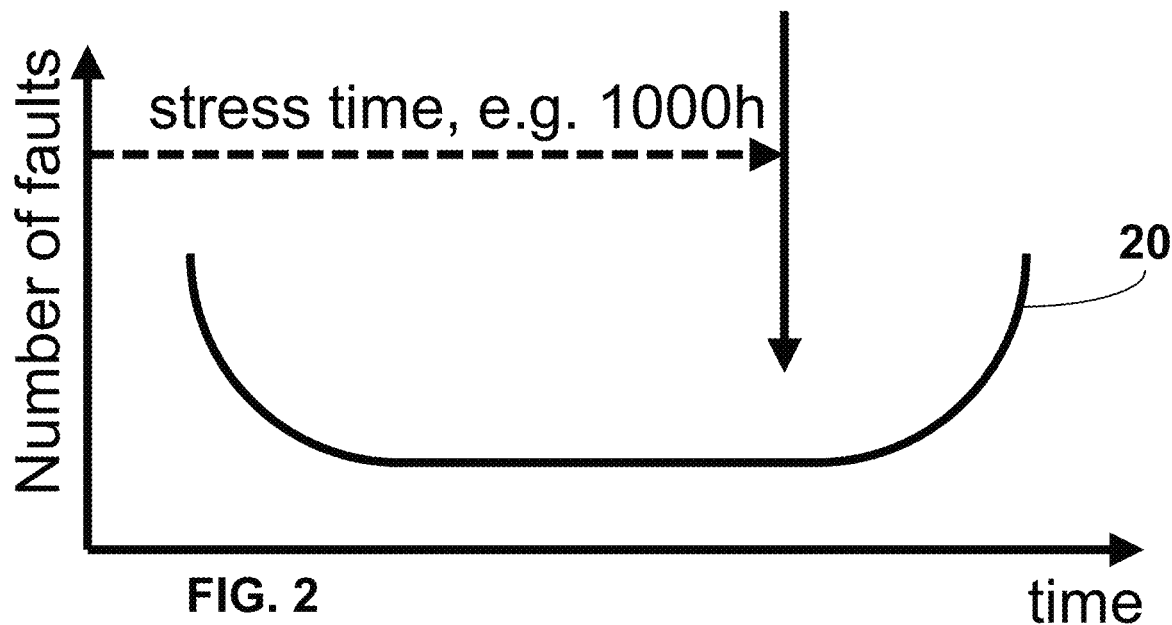
FIG. 2 is a conceptual graph showing example data associated with a high temperature operating life (HTOL) test.

FIG. 2 is a conceptual graph showing example data associated with an HTOL test. In this case, the curve shown in FIG. 2 may be referred to as a so-called bathtub-shaped curve 20. Over time, as shown in FIG. 2, the number of faults seen in a circuit goes down according to curve 20, flatlines, and then rises again as the circuit ages. In this example, an operation under stress for a given circuit may be defined as approximately 1000 hours, which provides a "guard band" of time before the expected number of faults rises on the right-most edge of bathtub-shaped curve 20. If the circuit does not fail when operating, e.g., at 150° Celsius for 1000 hours, the circuit may pass the accelerated stress test.

Figure 3:
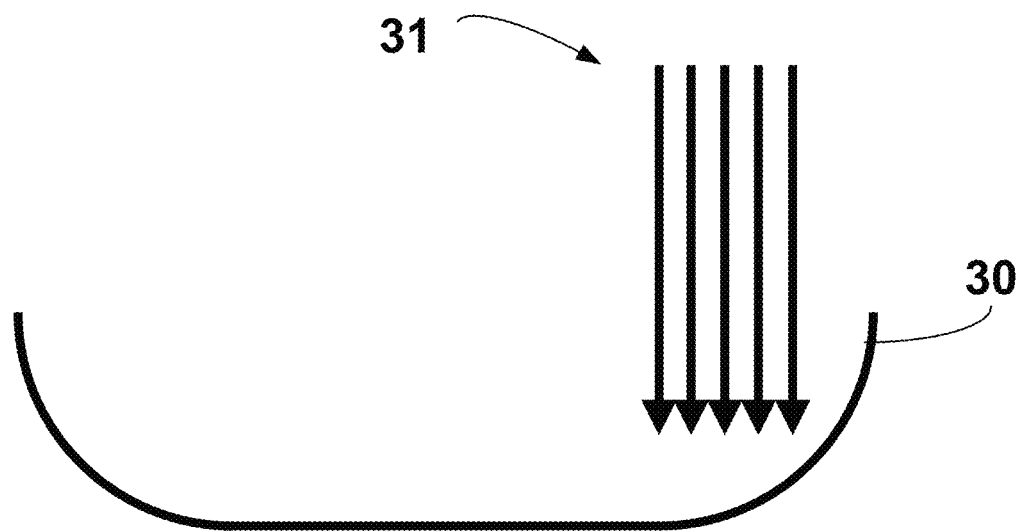
FIG. 3 is another conceptual graph showing an extended HTOL (eHTOL) test.

FIG. 3 is another conceptual graph showing an eHTOL test. The eHTOL test shown in FIG. 3 may be similar or identical to the HTOL test of FIG. 2 in many respects. However, with the eHTOL test shown in FIG. 3, a representative plurality of circuits is tested to determine actual failure points 31 along bathtub-shaped curve 30. Failure points 31 may comprise specifically measured times associated with representative circuits (e.g., representative of a larger batch of manufactured circuits) when the representative circuits failed in the stress test. Also, relative to FIG. 2, the tests shown in FIG. 3 may be "extended" in terms of the amount of stress that is applied to each circuit. Whereas the stress test of FIG. 2 extends for 1000 hours, the extended stress test of FIG. 3 may be extended in increments of time, until determining actual failures of representative circuits.

In some examples, eHTOL may be performed on a product level to find time of first failure. Thus, in some cases, the minimum measured failure time within failure points 31 may define one or more initial limit values for circuits in that product line. In other examples, the mean, median, or another statistical metric may be used to define limit values for a batch of circuits based on measured failure points 31 a representative sample of the batch. Also, limit values could also be defined based on in situ monitoring of the circuits in the eHTOL test. Measured internal parameters of circuits when they reach failure points 31, for example, may define one or more limit values that can be used for circuit monitoring in the field, according to this disclosure.

In this way, the techniques of this disclosure may be used to characterize the aging/fault behavior of a given circuit with in situ monitors, utilizing limit values from an initial eHTOL model. Further, as discussed in greater detail below, in some examples, the limit values initially defined for a circuit (e.g., via an eHTOL model) may be redefined or recharacterized based on actual circuit data gathered in the field.

In some examples, limit values may be initially defined by comparing monitored data with full chip characterization data (e.g., pass/fail) to derive limit values for in situ monitors or to classify data in case of applying machine learning. In some cases, machine learning may be used to define or improve the limit values.

During chip lifetime, in some examples, a larger system may compare monitored data with the limit values either stored on-chip, on-system, on dedicated servers, or remotely "in the cloud." In some cases, circuits of this disclosure may include a communication channel to access data, to perform system-level analysis, or apply machine learning to analyze monitored data, and possibly to determine if there is enough predicted lifetime for the circuit to perform its next operating cycle. In the case where a predicted lifetime is too short (or too near its end-of-life) to ensure performance in the next operating cycle, the circuit may be configured to provide a warning signal to the system (e.g., on chip, on-system, in the cloud, to a server, or to any system-level component). Also, in some cases, a circuit may be disabled if the circuit determines that it is too near its end-of-life.

The techniques of this disclosure may also be extended to a system on a chip (SoC), a multi-chip in package, a printed circuit board (PCB) or other larger system, e.g., to enable a larger system to monitor more than one chip within the system.

In some examples, characterization data of the field, may utilize an additional profile tracking monitor for a circuit in order to determine the time (age) of characterization data and the lifetime (until first permanent chip fault). This type of data, however, may not include the same level of modeling quality as with an eHTOL analysis, because no full functionality test runs in the field at repeated times. A circuit lifetime, in this case, may be determined by the first detected permanent fault in a given circuit, and such data may be accessible through the cloud or dedicated servers for other similar circuit products.

Some circuit aging characteristics are now discussed. There are many different aging effects for circuits. Aging effects may include negative bias temperature instability (NBTI), positive bias temperature instability (PBTI), hot carrier injection (HCI), time dependent dielectric breakthrough (TDDB), leakage, or other effects leading to a degradation of the circuit characteristics. Aging effects may have different acceleration factors depending on supply voltage and operating temperature (e.g., stress conditions). In addition, different aging effects may result in different recovery behavior in a given circuit. For example, NMOS and PMOS devices behave differently. Moreover, there is also a variation that exists in addition to that caused by circuit degradation, as well as a variation on the original device characteristics. Stress to a circuit may also depend on the use case of the circuit (e.g., activity, duty-cycle, signal waveform, or other factors). Stress may be defined by software and by user action (e.g., the use of the circuit in the field).

In some examples, in situ monitors of this disclosure may be more accurate than using replica circuits to model actual circuits because in situ monitors may monitor the impact of actual stress at the point of interest, including possible dependencies on other devices. Replica circuits, in contrast, may provide indirect measurements as a proxy to measurements associated with an actual circuit. In some examples, using different types of in situ monitors (e.g., a plurality of different in situ monitors for a circuit) may ensure better coverage of different sensitivities for different circuit blocks.

In some examples, an eHTOL can provide a relatively exact value for the time of fault even for different aging mechanisms. A guard band for a safe decision can be minimized compared to all solutions using replicas or by modeling aging effects.

One advantage to a classical in situ monitor is that it may be unnecessary to monitor a most critical path, which can be difficult. A critical path, for example, may depend on the use scenario, which is not known in advance. Faults may be identified by exhaustive product measurement during eHTOL and mapped to respective conditions of previously defined in situ monitors, which can be placed in different sensitive circuit locations within circuit architectures. During a productive use, specific conditions can be monitored to predict a fault of the device with a minimum possible safety guard band. Minimizing the safety guard band associated with one or more limit values, for example, may help to extend circuit product life in the field, and ensure that a circuit is not removed from use within a larger system before doing so is necessary.

Figure 4:
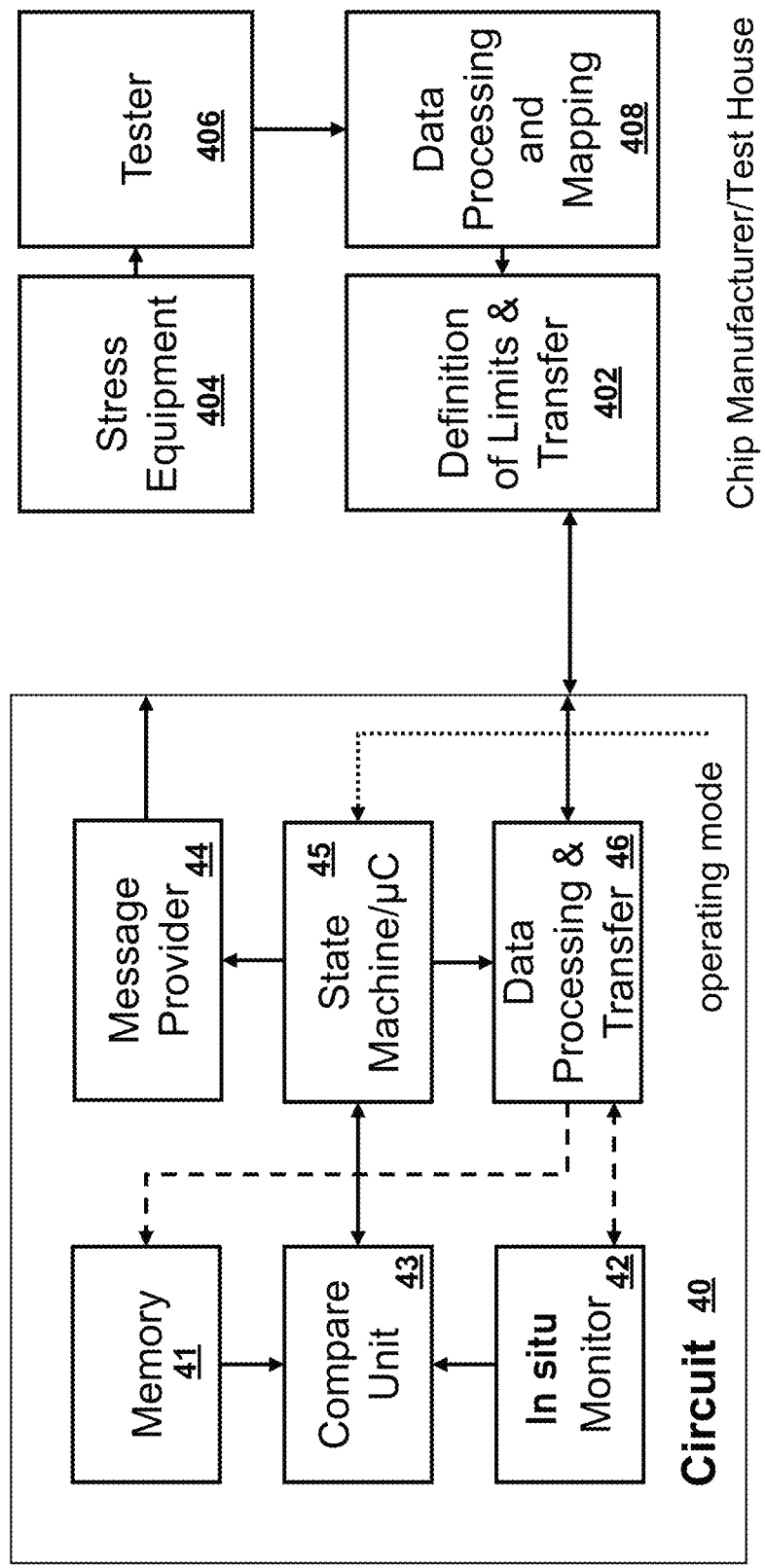
FIG. 4 is a block diagram of a circuit within a larger system according to one or more examples of this disclosure.

FIG. 4 is a block diagram of a circuit 40 within a larger system according to one or more examples of this disclosure. Circuit 40 may generally correspond to circuit 10 of FIG. 1, although circuit 40 is illustrated with different labels to help illustrate one or more aspects of this disclosure. In some examples, the functionality of compare unit 43, message provider 44, state machine/µC(microcontroller) 45, and data processing and transfer unit 46 may all reside in circuit lifetime model unit 18 of FIG. 1. Memory 41 of FIG. 4 may correspond to memory 16 of FIG. 1, and in situ monitor 42 may correspond to in situ monitor(s) 14. The circuit function unit (e.g., similar to circuit function unit 12 of FIG. 1) is not shown in FIG. 4.

In situ monitor 42 may monitor one or more internal parameters of a circuit function unit (not shown in FIG. 4) during operation of circuit 40, e.g., during a time when circuit functions are not being performed. Memory 41 may be configured to store one or more limit values associated with in situ monitor 42. Circuit 40 may be configured to determine whether circuit 40 has reached an end-of-life threshold based on the measured internal data from in situ monitor 42 and the limit values stored in memory 41. A state machine/µC 45 may determine the operating mode of a circuit function unit (not shown). Moreover, state machine/ μC 45 may generally control operations of circuit 50, including, for example, the exemplary operations shown in FIGS. 6 and 7. When the circuit function unit is not operating its normal functions, e.g., in a start-up mode, a power-down mode, or a periodic self-check mode, as determined by state machine/μC 45, compare unit 43 may compare parameters measured by in situ monitors 42 to limit values stored in memory 41. Based on the comparison by compare unit 43, circuit 40 can determine whether circuit 40 has reached an end-of-life threshold. Message provider 44 may be configured to output a system-level alert in response to circuit 40 determining that circuit 40 has reached an end-of-life threshold.

In order to program the limit values into memory 41, system-level components may be used. At a chip manufacturer or testing house, stress equipment 404 can be applied with a circuit tester 406 to create data processing and mapping 408, which in turn, can define limits 402. Limit values can be transferred to memory 41 of circuit 40 via data processing and transfer unit 46, via connection to the chip manufacturer or testing house. In this way, initial limit values for circuit 40 can be defined by a manufacturer or testing house, e.g., using eHTOL modeling as described herein. Such limit values can be programmed initially into circuit 40 for use in the field in assessing the remaining life of circuit 40 based on in situ monitoring.

In some examples, the limit values can be improved (e.g., guard bands for the limit values can be further minimized) based on actual data gathered in the field for other similar circuits that may have failed during use.

Figure 5:
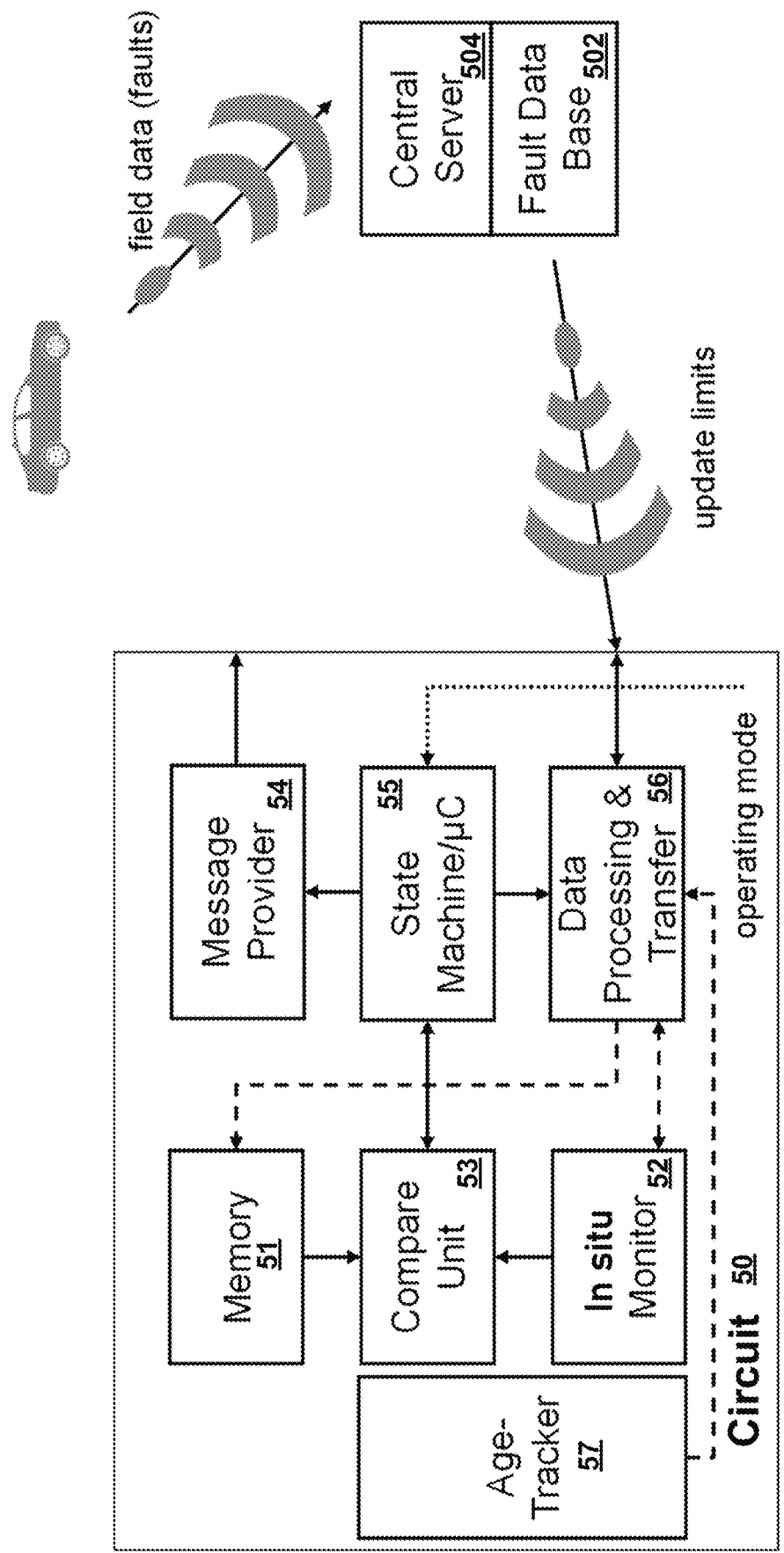
FIG. 5 is another block diagram of a circuit within a larger system according to one or more examples of this disclosure.

FIG. 5 is a block diagram of a circuit 50 within a larger system according to one or more examples of this disclosure. Circuit 50 may generally correspond to circuit 10 of FIG. 1, although circuit 50 is illustrated with different labels to help illustrate one or more aspects of this disclosure. In some examples, the functionality of compare unit 53, message provider 54, state machine/μC 55, age tracker 57, and data processing and transfer unit 56 may all reside in circuit lifetime model unit 18 of FIG. 1. Memory 51 of FIG. 5 may correspond to memory 16 of FIG. 1, and in situ monitor 52 may correspond to in situ monitor(s) 14. The circuit function unit (e.g., similar to circuit function unit 12 of FIG. 1) is not shown in FIG. 5.

Similar to the example shown in FIG. 4, in circuit 50 of FIG. 5, in situ monitor 52 may monitor one or more internal parameters of a circuit function unit (not shown in FIG. 5) during operation of circuit 50. Memory 51 may be configured to store one or more limit values associated with in situ monitor 52. Circuit 50 may be configured to determine whether circuit 50 has reached an end-of-life threshold based on the measured internal data from in situ monitor 52 and the limit values stored in memory 51. A state machine/ μC 55 may determine the operating mode of a circuit function unit (not shown). When the circuit function unit is not operating its normal functions, e.g., in a start-up mode, a power-down mode, or a periodic self-check mode, as determined by state machine/μC 55, compare unit 53 may compare parameters measured by in situ monitors 52 to limit values stored in memory 51. Based on the comparison by compare unit 53, circuit 50 can determine whether circuit 50 has reached an end-of-life threshold. Message provider 54 may be configured to output a system-level alert in response to circuit 50 determining that circuit 50 has reached an end-of-life threshold.

In order to redefine or re-program the limit values into memory 51, system-level components may be used. As shown in FIG. 5, for example, data processing and transfer unit 56 of circuit 50 may communicate with a fault database 502 of a central server 504. Central server 504 may receive field data (e.g., real faults) associated with circuits being used in the field, e.g., in automobiles. Any fault stored in fault database 502 may also identify the age of the circuit having the fault. Age tracker 57 of circuit 50, for example, may track the age of circuit 50, and in the event of a fault in circuit 50 (e.g., a fault in functional circuit unit being monitored by in situ monitor 52), data processing and transfer unit 56 may communicate the fault and the age of circuit 50 to central server 504 for inclusion in fault data base 502. Central server 504 and fault database 502 are one example of an external computer, although other types of external computers may be used for communicating updates to limit values to circuit 50.

Circuit 50 may be configured to receive updated limit values to be stored in memory 51 from fault data base 502 of central server 504. In this way, limit values can be improved (e.g., guard bands for the limit values can be further minimized) based on actual data gathered in the field for other similar circuits that have failed in the field during use.

In some examples, in situ monitors may be used in combination with a checker unit and storage elements for storing dedicated limits (e.g., without mapping based on eHTOL and based on a fixed offset that is pre-defined in some way to define the expected circuit life). In addition, in some cases, failure prediction is a very desirable and sensitive task, and may lead to user dissatisfaction, e.g., if circuits have to be replaced too often. Low guard bands/ offsets to extend product life are desirable, and safe decisions for circuit operation before reaching end-of-life thresholds are also desirable.

Consistent with the systems shown in FIG. 5 and FIG. 1, in some examples, a system may comprise a circuit and an external computer. The circuit may comprise a function unit configured to perform a circuit function; one or more in situ monitors configured to measure internal data associated with the circuit; a memory configured to store one or more limit values associated with the one or more in situ monitors; a lifetime model unit configured to determine whether the circuit has reached an end-of-life threshold based on the measured internal data from the one or more in situ monitors and the limit values; and a data transfer unit. The external computer may be configured to communicate with the data transfer unit, wherein the data transfer unit is configured to receive updates to the limit values from the external computer, wherein the updates are based on other data associated with one or more other circuits that have failed during operation. In some examples, the data transfer unit (e.g., data processing and transfer unit 56 of FIG. 5) is configured to communicate the measured internal data from in situ monitors 52 to an external computer (e.g., server 504) in response to determining that the circuit has reached the end-of-life threshold.

Age tracker 57 may be configured to track an age associated with the circuit 50. In order to provide updates to fault data base 502 to improve limits of other circuits in the field, in some examples, data processing and transfer unit 56 is configured to communicate the age associated with circuit 50 and a status indication (e.g., a fault or non-fault indication) for circuit 50 to external computer. Updates to limit values in fault data base 502 may be based on the other data associated with one or more other circuits that have failed during operation, and possibly the status indication and age associated with circuit 50. Thus, data processing and transfer unit 56 may be configured to communicate an age associated with circuit 50 and a status indication (e.g., a fault indication) to an external computer in response to circuit 50 experiencing a fault. In some examples, the age associated with circuit 50 is communicated to the external computer only when circuit 50 experiences a fault, and in other examples, the age associated with circuit 50 may be communicated to the external computer prior to a fault in order to help define adjusted limit values for circuit 50 that are based, in part, on the current age of circuit 50.

Figure 6:
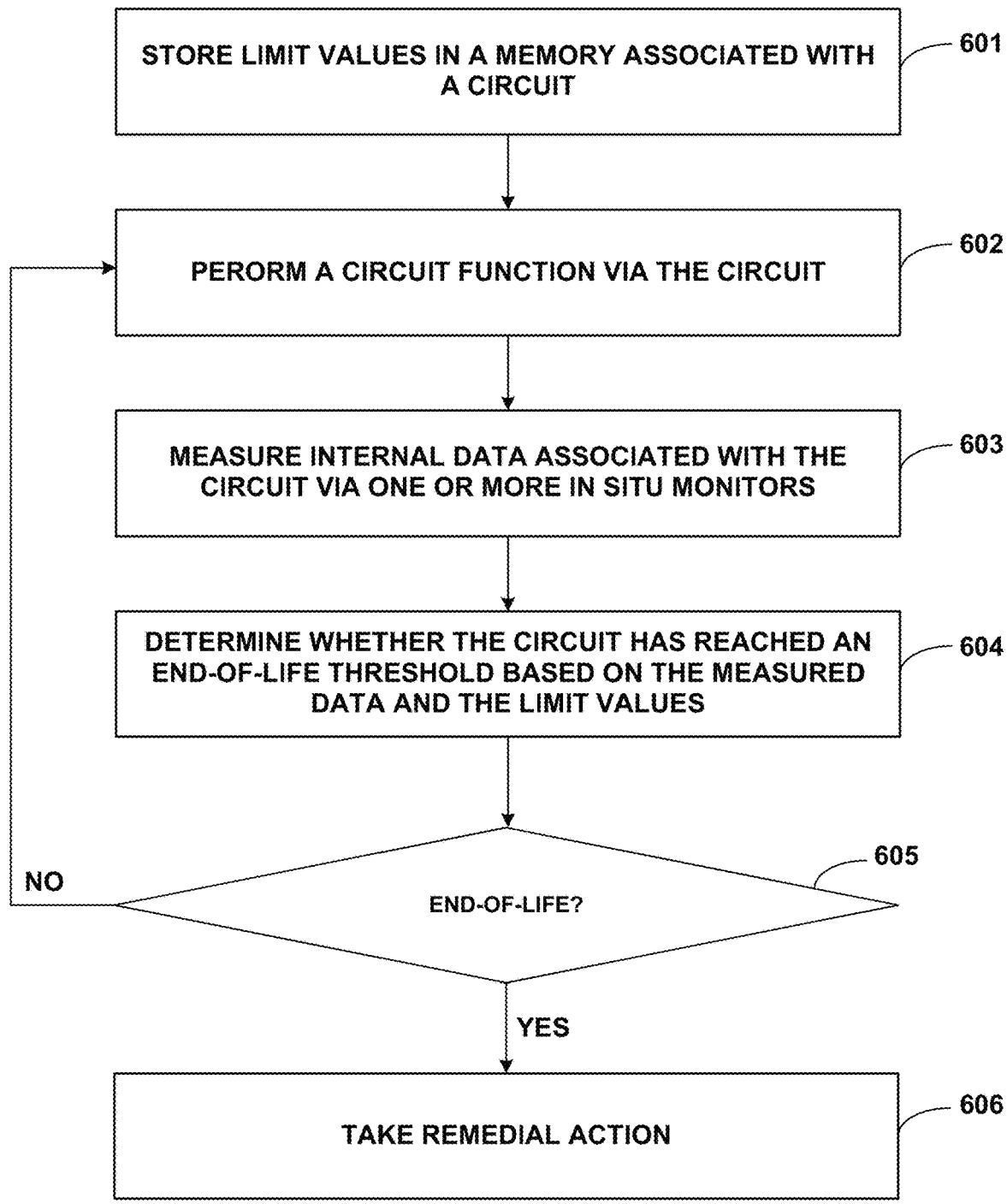
FIG. 6 is a flow diagram showing operation of a circuit according to an example of this disclosure.

FIG. 6 is a flow diagram showing operation of a circuit according to an example of this disclosure. FIG. 6 will be described from the perspective of circuit 10 of FIG. 1, although other circuits may perform similar methods. As shown in FIG. 6, a method of operating a circuit 10 may comprise storing one or more limit values 15 in a memory 16 associated with circuit 10 (601), and performing a circuit function via circuit 10 (602). Circuit function unit 12 of circuit 10, for example, may be configured to perform the circuit function (602). One or more in situ monitors 14 of circuit 10 measure internal data associated with circuit (603). The one or more limit values 15 stored in memory 16 are defined for the one or more in situ monitors 14. Circuit lifetime model unit 18 determines whether circuit 10 has reached an end-of-life threshold based on the measured internal data from the one or more in situ monitors 14 and the limit values 15 stored in memory 16.

As described herein, in some examples, the limit values are defined based on an accelerated stress test that is performed on a subset of circuits during a manufacturing process of a set of circuits, wherein the subset is a representative portion of the set. Circuit 10 may also be part of the set such that the representative portion of the set is also representative of circuit 10. In some examples, determining whether circuit 10 has reached an end-of-life threshold (604) includes comparing the measured internal data from the one or more in situ monitors 14 to the one or more limits 15 in memory. In various examples, measuring internal data associated with circuit 10 via one or more in situ monitors 14 (603) may comprise measuring the internal data under pre-defined operating conditions; measuring the internal data during a start-up process; measuring the internal data during a power-down process; and/or measuring the internal data during a periodic end-of-life check process. Indeed, in some examples, it is desirable to measure data during operation of circuit 10 via one or more in situ monitors 14 at times when circuit function unit 12 is not performing its intended circuit function.

As further shown in FIG. 6, in some examples, circuit lifetime model unit 18 may determine whether circuit 10 has reached an end-of-life threshold (605). In response to determining that circuit 10 has reached an end-of-life threshold, circuit lifetime model unit 18 may be configured to initiate remedial action for circuit 10 (606). Remedial action (606), for example, may comprise outputting an alert or fault, disabling circuit 10, disabling circuit function unit 12, disabling one or more components of a larger system, or other actions to promote safety or reliability in a larger system. In some examples, lifetime model unit 18 may be configured disable some or all of circuit 10 (e.g., disable circuit function unit 12) in response to determining that circuit 10 has reached its end-of-life threshold. In some examples, lifetime model unit 18 may be configured to issue an alert in response to determining that circuit 10 has reached its end-of-life threshold. An alert from lifetime model unit 18, for example, may comprises a predictive maintenance alert sent to another circuit, such as an ECU, a system-level microprocessor or any external system-level circuit. Based on the predictive maintenance alert, a larger system may schedule, suggest, or require maintenance on circuit 10 or circuit function unit 12, e.g., before the failure occurs and/or before any actual safety issues occur due to aging, stress, or overuse of circuit 10.

Figure 7:
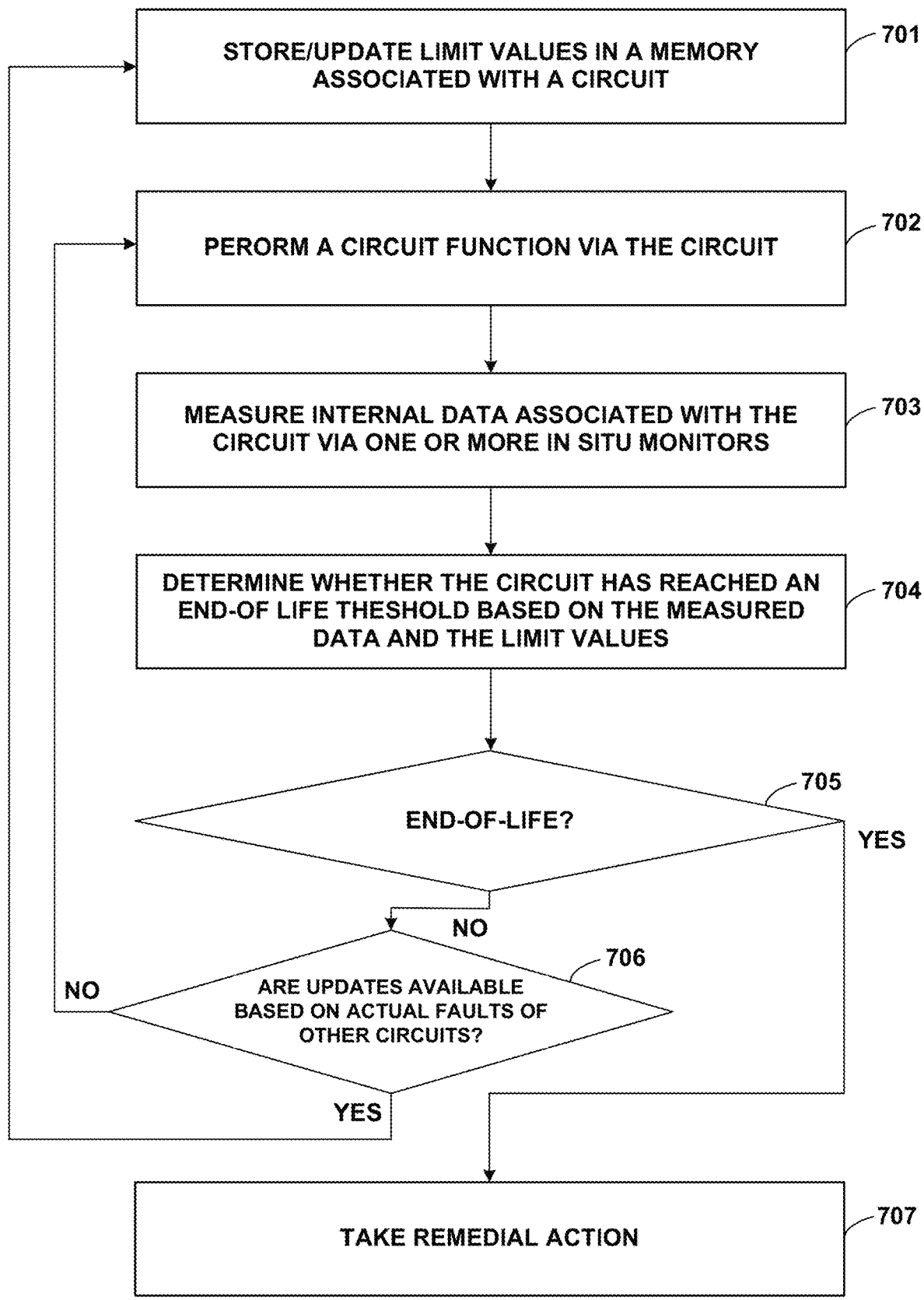
FIG. 7 is another flow diagram showing operation of a circuit according to an example of this disclosure.

FIG. 7 is another flow diagram showing operation of a circuit according to an example of this disclosure. The process of FIG. 7 is similar to that of FIG. 6 in many respects.

As shown in FIG. 7, a method of operating a circuit 10 may comprise storing one or more limit values 15 in a memory 16 associated with circuit 10 (701), and performing a circuit function via circuit 10 (702). Circuit function unit 12 of circuit 10, for example, may be configured to perform the circuit function (702). One or more in situ monitors 14 of circuit 10 measure internal data associated with circuit function unit 12 (703). The one or more limit values 15 stored in memory 16 are defined for the one or more in situ monitors 14. Circuit lifetime model unit 18 determines whether circuit 10 has reached an end-of-life threshold based on the measured internal data from the one or more in situ monitors 14 and the limit values 15 stored in memory 16.

As described herein, in some examples, the limit values are defined based on an accelerated stress test that is performed on a subset of circuits during a manufacturing process of a set of circuits, wherein the subset is a representative portion of the set. Circuit 10 may also be part of the set such that the representative portion of the set is also representative of circuit 10. In some examples, determining whether circuit 10 has reached an end-of-life threshold (704) includes comparing the measured internal data from the one or more in situ monitors 14 to the one or more limits 15 in memory. In various examples, measuring internal data of circuit 10 via one or more in situ monitors 14 (703) may comprise measuring the internal data under pre-defined operating conditions; measuring the internal data during a start-up process; measuring the internal data during a power-down process; and/or measuring the internal data during a periodic end-of-life check process. Indeed, in some examples, it is desirable to measure data during operation of circuit 10 via one or more in situ monitors 14 at times when circuit function unit 12 is not performing its intended circuit function.

As further shown in FIG. 7, in some examples, circuit lifetime model unit 18 may determine whether circuit 10 has reached an end-of-life threshold (705). In response to determining that circuit 10 has reached an end-of-life threshold (yes branch of 705), circuit lifetime model unit 18 may be configured to initiate remedial action for circuit 10 (707). Remedial action (707), for example, may comprise outputting an alert or fault, disabling circuit 10, disabling circuit function unit 12, disabling one or more components of a larger system, or other actions to promote safety or reliability in a larger system. In some examples, lifetime model unit 18 may be configured disable some or all of circuit 10 (e.g., disable circuit function unit 12) in response to determining that circuit 10 has reached its end-of-life threshold. In some examples, lifetime model unit 18 may be configured to issue an alert in response to determining that circuit 10 has reached its end-of-life threshold. An alert from lifetime model unit 18, for example, may comprises a predictive maintenance alert sent to another circuit, such as an ECU, a system-level microprocessor or any external system-level circuit. Based on the predictive maintenance alert, a larger system may schedule, suggest, or require maintenance on circuit 10 or circuit function unit 12, e.g., before the failure occurs and/or before any actual safety issues occur due to aging, stress, or overuse of circuit 10.

In FIG. 7, as long as circuit 10 has not reached its end-of-life threshold (no branch of 705), updates can be periodically be made to limit values 15 to improve end-of-life modeling. Thus, if there are updates available based on actual faults of other circuits in the field (yes branch of 706), circuit 10 may be configured to store one or more limit values 15 (in this case, updates to limit values 15) in a memory 16 associated with circuit 10 (701). Circuit 10 may receive updates to limit values 15 from an external computer, wherein the updates are based on other data associated with one or more other circuits that have failed during operation.

As noted above and consistent with FIGS. 6 and 7, in some examples, circuit 10 may be further configured to communicate an age associated with circuit 10 and a status indication to the external computer in response to circuit 10 experiencing a fault. This can help with updates to limit values for use by other circuits in the field that have not yet experienced a fault.

In some examples, a method consistent with FIG. 6 or 7 may further include communicating the measured internal data from the one or more in situ monitors 14 to an external computer in response to determining that circuit 10 has reached the end-of-life threshold. Again, determining whether circuit 10 has reached an end-of-life threshold may include comparing the measured internal data from one or more in situ monitors 14 to the one or more limits 15 in memory.

In some examples, in order to achieve an integrated circuit with integrated end-of-life monitoring features according to this disclosure, circuit 10 of FIG. 1 may be housed within a molding compound. In other words, circuit function unit 12, in situ monitor(s) 14, memory 16 and lifetime model unit 18 may all reside within a molding compound of a circuit package. Alternatively, in other examples, one or more of circuit function unit 12, in situ monitor(s) 14, memory 16 and lifetime model unit 18 may comprise separate circuit packages that are assembled to collectively form circuit 10. Again, however, by implementing circuit function unit 12, in situ monitor(s) 14, memory 16 and lifetime model unit 18 all within a molding compound of a circuit package, a self-contained functional circuit with integrated end-of-life monitoring functionality can be achieved.

The following numbered clauses demonstrate one or more aspects of the disclosure.

Clause 1—A circuit comprising: a function unit configured to perform a circuit function; one or more in situ monitors configured to measure internal data associated with the circuit; a memory configured to store one or more limit values associated with the one or more in situ monitors; and a lifetime model unit configured to determine whether the circuit has reached an end-of-life threshold based on the measured internal data from the one or more in situ monitors and the limit values.

Clause 2—The circuit of clause 1, wherein the limit values are defined based on an accelerated stress test that is performed on a subset of circuits during a manufacturing process of a set of circuits, wherein the subset is a representative portion of the set.

Clause 3—The circuit of clause 1 or 2, wherein the accelerated stress test comprises an eHTOL test.

Clause 4—The circuit of any of clauses 1-3, wherein the one or more in situ monitors are configured to measure the internal data under pre-defined operating conditions of the circuit.

Clause 5—The circuit of any of clauses 1-4, wherein the one or more in situ monitors are configured to measure the internal data during a start-up process associated with the circuit.

Clause 6—The circuit of any of clauses 1-5, wherein the one or more in situ monitors are configured to measure the internal data during a power-down process associated with the circuit.

Clause 7—The circuit of any of clauses 1-6, wherein the one or more in situ monitors are configured to measure the internal data during a periodic end-of-life check process for the circuit.

Clause 8—The circuit of any of clauses 1-7, further comprising a data transfer unit configured to receive updates to the limit values, wherein the updates are based on other data associated with one or more other circuits that have failed during operation.

Clause 9—The circuit of any of clauses 1-8, further comprising an age tracker configured to track an age associated with the circuit, wherein a data transfer unit is configured to communicate an age associated with the circuit and a status indication to an external computer in response to the circuit experiencing a fault.

Clause 10—The circuit of any of clauses 1-9, further comprising a data transfer unit configured to communicate the measured internal data from the one or more in situ monitors to an external computer in response to the lifetime model unit determining that the circuit has reached the end-of-life threshold.

Clause 11—The circuit of any of clauses 1-10, wherein the lifetime model unit includes a compare unit configured to compare the measured internal data to the one or more limit values.

Clause 12—The circuit of any of clauses 1-11, wherein the lifetime model unit is configured to output an alert in response to identifying that the circuit has reached the end-of-life threshold.

Clause 13—The circuit of any of clauses 1-12, wherein the lifetime model unit is configured to disable at least a portion of the circuit in response to identifying that the circuit has reached the end-of-life threshold.

Clause 14—The circuit of any of clauses 1-13, wherein function unit comprises one or more circuit units selected from a group consisting of: a driver circuit; a logic circuit; a motor driver; a driver circuit for driving a load; an oscillator circuit; a level shifter circuit; a phase shift circuit; a phase locked loop circuit; an analog-to-digital converter circuit; a digital-to-analog converter circuit; an ALU; a processor; a microcontroller; a DSP; a communication interface circuit; a digital logic circuit; a state machine; a signal processing circuit; a control circuit; an analog circuit; a memory circuit; or a sensor.

Clause 15—A method of operating a circuit, the method comprising: storing one or more limit values in a memory associated with the circuit; performing a circuit function via the circuit; measuring internal data of the circuit via one or more in situ monitors, wherein the one or more limit values are defined for the one or more in situ monitors; and determining whether the circuit has reached an end-of-life threshold based on the measured internal data from the one or more in situ monitors and the limit values stored in the memory.

Clause 16—The method of clause 15, wherein the limit values are defined based on an accelerated stress test that is performed on a subset of circuits during a manufacturing process of a set of circuits, wherein the subset is a representative portion of the set.

Clause 17—The method of clause 15 or 16, further comprising: receiving updates to the limit values from an external computer, wherein the updates are based on other data associated with one or more other circuits that have failed during operation.

Clause 18—The method of any of clauses 15-17, further comprising: communicating an age associated with the circuit and a status indication to the external computer in response to the circuit experiencing a fault.

Clause 19—The method of any of clauses claim 15-18, further comprising: communicating the measured internal data from the one or more in situ monitors to an external computer in response to determining that the circuit has reached the end-of-life threshold.

Clause 20—The method of any of clauses claim 15-19, wherein determining whether the circuit has reached an end-of-life threshold includes comparing the measured internal data to the one or more limits.

Clause 21—The method of any of clauses claim 15-20, further comprising outputting an alert in response to determining that the circuit has reached the end-of-life threshold.

Clause 22—The method of any of clauses claim 15-21, wherein measuring the internal data via the one or more in situ monitors comprises: measuring the internal data under pre-defined operating conditions; measuring the internal data during a start-up process; measuring the internal data during a power-down process; or measuring the internal data during a periodic end-of-life check process.

Clause 23—A system comprising: a circuit comprising: a function unit configured to perform a circuit function; one or more in situ monitors configured to measure internal data associated with the circuit; a memory configured to store one or more limit values associated with the one or more in situ monitors; a lifetime model unit configured to determine whether the circuit has reached an end-of-life threshold based on the measured internal data from the one or more in situ monitors and the limit values; and a data transfer unit; and an external computer configured to communicate with the data transfer unit, wherein the data transfer unit is configured to receive updates to the limit values from the external computer, wherein the updates are based on other data associated with one or more other circuits that have failed during operation.

Clause 24—The system of clause 23, wherein the data transfer unit is configured to communicate the measured internal data from the one or more in situ monitors to an external computer in response to determining that the circuit has reached the end-of-life threshold.

Clause 25—The system of clause 23 or 24, wherein the circuit further comprises an age tracker configured to track an age associated with the circuit, wherein the data transfer unit is configured to communicate the age associated with the circuit and a status indication for the circuit to the external computer, and wherein the updates to the limit values are based on the other data associated with one or more other circuits that have failed during operation and the age associated with the circuit.

Various examples of the disclosure have been described. Any combination of the described systems, operations, or functions is contemplated. These and other examples are within the scope of the following claims.

What is claimed is:

1. A circuit configured to be used within a system, the circuit comprising:
    a functional circuit that is configured to perform a circuit function;
    one or more in situ monitors configured to measure internal data associated with the functional circuit, wherein the internal data measured by the one or more in situ monitors includes one or more of leakage current, a time of data arrival compared to a clock, failure counts, counts of error correction codes, delay drift, or frequency drift;
    a memory configured to store one or more limit values associated with the one or more in situ monitors; and
    a lifetime model unit implemented in circuitry and configured to determine whether the functional circuit has reached an end-of-life threshold based on the measured internal data from the one or more in situ monitors and the limit values, wherein the lifetime model unit includes a compare unit implemented in the circuitry and configured to compare the measured internal data to the one or more limit values, wherein the lifetime model unit is configured to determine whether the functional circuit has reached the end-of-life threshold based on the compare unit comparing the measured internal data to the one or more limit values stored in the memory, and wherein the lifetime model unit includes a message provider implemented in the circuitry and configured to output a system-level alert to another circuit of the system to cause replacement of the circuit within the system, in response to the lifetime model unit determining that the functional circuit has reached the end-of-life threshold, wherein the lifetime model unit is further configured to disable at least a portion of the circuit in response to identifying that the circuit has reached the end-of-life threshold.

2. The circuit of claim 1, wherein the one or more in situ monitors are configured to measure the internal data under pre-defined operating conditions of the circuit.

3. The circuit of claim 2, wherein the one or more in situ monitors are configured to measure the internal data during a start-up process associated with the circuit.

4. The circuit of claim 2, wherein the one or more in situ monitors are configured to measure the internal data during a power-down process associated with the circuit.

5. The circuit of claim 2, wherein the one or more in situ monitors are configured to measure the internal data during a periodic end-of-life check process for the circuit.

6. The circuit of claim 1, wherein the limit values are defined based on an accelerated stress test that is performed on a subset of circuits during a manufacturing process of a set of circuits, wherein the subset is a representative portion of the set.

7. The circuit of claim 6, wherein the accelerated stress test comprises an extended high temperature operating life (eHTOL) test.

8. The circuit of claim 1, further comprising a data transfer unit configured to receive updates to the limit values, wherein the updates are based on other data associated with one or more other circuits that have failed during operation.

9. The circuit of claim 8, further comprising an age tracker configured to track an age associated with the circuit,
    wherein the data transfer unit is configured to communicate an age associated with the circuit and a status indication to an external computer in response to the circuit experiencing a fault.

10. The circuit of claim 1, further comprising a data transfer unit configured to communicate the measured internal data from the one or more in situ monitors to an external computer in response to the lifetime model unit determining that the circuit has reached the end-of-life threshold.

11. The circuit of claim 1, wherein functional circuit comprises one or more circuit units selected from a group consisting of:
   a driver circuit;
   a logic circuit;
   a motor driver;
   a driver circuit for driving a load;
   an oscillator circuit;
   a level shifter circuit;
   a phase shift circuit;
   a phase locked loop circuit;
   an analog-to-digital converter circuit;
   a digital-to-analog converter circuit;
   an arithmetic logic unit (ALU);
   a processor;
   a microcontroller;
   a digital signal processor (DSP);
   a communication interface circuit;
   a digital logic circuit;
   a state machine;
   a signal processing circuit;
   a control circuit;
   an analog circuit;
   a memory circuit; or
   a sensor.

12. A method of operating a circuit within a system, the method comprising:
   storing one or more limit values in a memory associated with the circuit;
   performing a circuit function via the circuit;
   measuring internal data of the circuit via one or more in situ monitors, wherein the one or more limit values are defined for the one or more in situ monitors, and wherein the internal data measured by the one or more in situ monitors includes one or more of leakage current, a time of data arrival compared to a clock, failure counts, counts of error correction codes, delay drift, or frequency drift;
   determining whether the circuit has reached an end-of-life threshold based on the measured internal data from the one or more in situ monitors and the limit values stored in the memory, wherein determining whether the circuit has reached an end-of-life threshold includes comparing the measured internal data to the one or more limit values;
   outputting a system-level alert to another circuit of the system to cause replacement of the circuit within the system, in response to determining that the circuit has reached the end-of-life threshold; and
   disabling at least a portion of the circuit in response to identifying that the circuit has reached the end-of-life threshold.

13. The method of claim 12, wherein the limit values are defined based on an accelerated stress test that is performed on a subset of circuits during a manufacturing process of a set of circuits, wherein the subset is a representative portion of the set.

14. The method of claim 12, further comprising:
   receiving updates to the limit values from an external computer, wherein the updates are based on other data associated with one or more other circuits that have failed during operation.

15. The method of claim 12, further comprising:
   communicating an age associated with the circuit and a status indication to the external computer in response to the circuit experiencing a fault.

16. The method of claim 12, further comprising:
   communicating the measured internal data from the one or more in situ monitors to an external computer in response to determining that the circuit has reached the end-of-life threshold.

17. The method of claim 12, wherein measuring the internal data via the one or more in situ monitors comprises:
   measuring the internal data under pre-defined operating conditions;
   measuring the internal data during a start-up process;
   measuring the internal data during a power-down process; or
   measuring the internal data during a periodic end-of-life check process.

18. A circuit comprising:
   a function unit configured to perform a circuit function;
   one or more in situ monitors configured to measure internal data associated with the circuit, wherein the internal data measured by the one or more in situ monitors includes one or more of leakage current, a time of data arrival compared to a clock, failure counts, counts of error correction codes, delay drift, or frequency drift;
   a memory configured to store one or more limit values associated with the one or more in situ monitors; and
   a lifetime model unit configured to determine whether the circuit has reached an end-of-life threshold based on the measured internal data from the one or more in situ monitors and the limit values, wherein the lifetime model unit is configured to disable at least a portion of the circuit in response to identifying that the circuit has reached the end-of-life threshold.

* * * * *